US 6,665,180 B2

(12) United States Patent
Lehman et al.

(10) Patent No.: US 6,665,180 B2
(45) Date of Patent: Dec. 16, 2003

(54) SYSTEM FOR COOLING A COMPONENT IN A COMPUTER SYSTEM

(75) Inventors: Bret W. Lehman, Raleigh, NC (US); Jason Aaron Matteson, Raleigh, NC (US); Graham Michael White, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/887,740

(22) Filed: Jun. 22, 2001

(65) Prior Publication Data

US 2002/0196604 A1 Dec. 26, 2002

(51) Int. Cl.$^7$ .................................................. G06F 1/16
(52) U.S. Cl. ...................... 361/688; 361/683; 361/687; 165/104.33; 62/259.2
(58) Field of Search ........................... 361/683, 687, 361/688, 689, 690, 699, 702, 704, 705, 714–719, 695–698, 700; 165/80.2, 80.3, 80.4, 104.33, 121, 104.34, 122–125; 257/713, 718, 719–727, 708–711; 174/15.2, 16.3, 252; 62/259.2, 418, 3.2

(56) References Cited

U.S. PATENT DOCUMENTS

| 4,447,842 A | | 5/1984 | Berg .......................... 361/386 |
| 4,583,582 A | | 4/1986 | Grossman ..................... 165/32 |
| 5,203,399 A | * | 4/1993 | Koizumi ................. 165/104.29 |
| 5,587,880 A | * | 12/1996 | Phillips et al. ............... 361/687 |
| 5,606,341 A | * | 2/1997 | Aguilera ....................... 345/87 |
| 5,646,824 A | * | 7/1997 | Ohashi et al. ............... 361/699 |
| 5,794,450 A | | 8/1998 | Alexander ........................ 62/6 |
| 5,870,284 A | | 2/1999 | Stewart et al. ............... 361/699 |
| 5,940,270 A | | 8/1999 | Puckett ........................ 361/699 |
| 6,018,465 A | | 1/2000 | Borkar et al. ................ 361/825 |
| 6,115,251 A | | 9/2000 | Patel et al. .................. 361/699 |
| 6,196,003 B1 | * | 3/2001 | Macias et al. ................. 62/3.7 |
| 6,208,512 B1 | * | 3/2001 | Goldowsky et al. ......... 361/699 |
| 6,234,240 B1 | * | 5/2001 | Cheon ........................ 165/80.3 |

FOREIGN PATENT DOCUMENTS

| DE | 19911475 A1 | * 3/1999 | ......... H01L/000/00 |
| EP | 0582216 | 7/1993 | ......... H01L/23/473 |
| EP | 0823611 | 2/1998 | ............ F28F/13/00 |
| JP | 60032349 | 2/1985 | ........... H01L/23/46 |

* cited by examiner

Primary Examiner—Darren Schuberg
Assistant Examiner—Michael Datskovsky
(74) Attorney, Agent, or Firm—Sawyer Law Group, LLP; Carlos Munoz-Bustamante

(57) ABSTRACT

A system for cooling a component in a computer system is disclosed. The cooling system of the present invention comprises a heat collection chamber including an inlet opening and an outlet opening, wherein the inlet opening is located in a position vertically higher than a location of the outlet opening. The system includes a heat conductive jacket adapted to be in thermal contact with the component. The jacket includes an inlet port and an outlet port through which a cooling fluid circulates. The system also includes a first hollow tube for coupling the outlet port to the inlet opening, and a second hollow tube for coupling the outlet opening to the inlet port.

19 Claims, 4 Drawing Sheets

US 6,665,180 B2

SYSTEM FOR COOLING A COMPONENT IN A COMPUTER SYSTEM

FIELD OF THE INVENTION

The present invention relates to cooling components in a computer system, and more particularly to a highly efficient system for cooling high heat generating components.

BACKGROUND OF THE INVENTION

As computer components evolve into more powerful devices, their power requirements consequently increase. With this increase in power consumption, a commensurate increase in power dissipation in the form of heat results. Microprocessors are a major source of heat in computer systems. One computer system might incorporate several microprocessors, thereby multiplying the amount of heat generated by the system. Moreover, the situation is compounded when several pieces of equipment are stored vertically in a rack, where each piece of equipment contains power consuming and heat generating components.

Heat dissipation is an important consideration in the design of modern-day computer systems. If heat is not adequately dissipated from the system, components may fail causing catastrophic damage to the system. To date, cooling systems have utilized finned heat sinks, augmented by axial flow fans mounted on the heat sink and/or air movers in the form of fans within or around the computer system. Nevertheless, as the amount of heat generated by the components increases, the current cooling systems will prove inadequate because larger heat sinks and/or fans will not fit into the already cramped space in and around a computer system.

Accordingly, a need exists for a more efficient system for cooling components in a computer system. The system should be compact, highly reliable, and cost effective. The present invention fulfills this need and provides related advantages.

SUMMARY OF THE INVENTION

A system for cooling a component in a computer system is disclosed. The cooling system of the present invention comprises a heat collection chamber including an inlet opening and an outlet opening, wherein the inlet opening is located in a position vertically higher than a location of the outlet opening. The system includes a heat conductive jacket adapted to be in thermal contact with the component. The jacket includes an inlet port and an outlet port through which a cooling fluid circulates. The system also includes a first hollow tube for coupling the outlet port to the inlet opening, and a second hollow tube for coupling the outlet opening to the inlet port.

Through the aspects of the present invention, the chassis of the computer system or equipment is advantageously used to dissipate heat generated from the enclosed components. By utilizing the present invention, heat sinks, and/or fans are eliminated. The present invention is reliable, and relatively easy to implement given the current related technology.

DETAILED DESCRIPTION

The present invention relates to cooling components in a computer system, and more particularly to a highly efficient system for cooling high heat generating components. The following description is presented to enable one of ordinary skill in the art to make and use the invention and is provided in the context of a patent application and its requirements. Various modifications to the preferred embodiment and the generic principles and features described herein will be readily apparent to those skilled in the art. For instance, although the component in the preferred embodiment is a microprocessor, the present invention could be utilized for any heat generating component. Thus, the present invention is not intended to be limited to the embodiment shown but is to be accorded the widest scope consistent with the principles and features described herein.

In accordance with a preferred embodiment of the present invention, the component cooling system utilizes a heat conductive jacket affixed to the component, through which a cooling fluid is circulated. The cooling fluid absorbs heat generated from the component via the heat conductive jacket, and transfers the heat to a heat collection chamber formed out of the chassis enclosing the computer system. The heat is then dissipated into the environment directly through the chassis. The now cooled cooling fluid circulates back to the heat conductive jacket to repeat the process.

Figure 1:
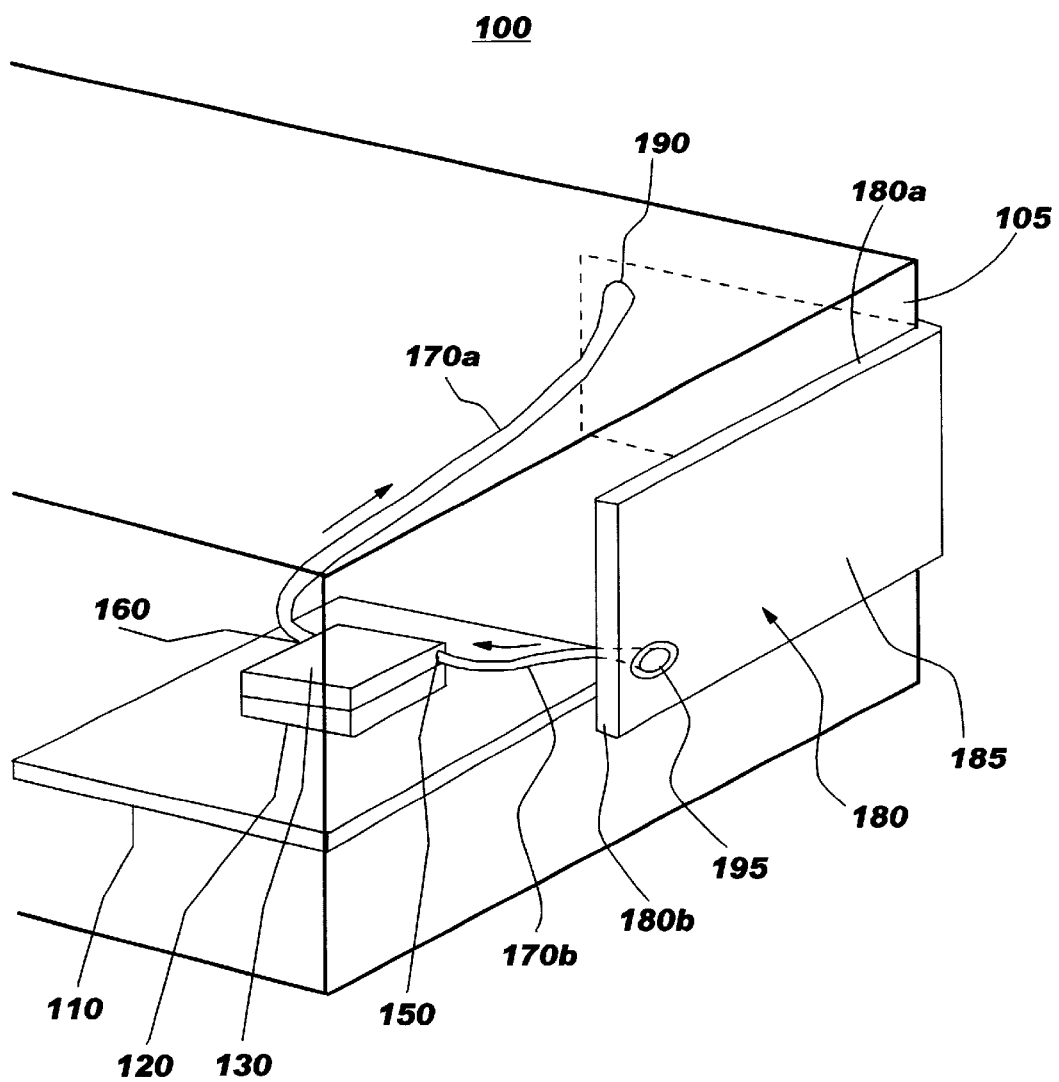
FIG. 1 is a perspective of a computer system incorporating the cooling system in accordance with the preferred embodiment of the present invention.

For a better understanding of the present invention, please refer to FIG. 1, which is a perspective of a computer system 100 incorporating the cooling system in accordance with the preferred embodiment of the present invention. The computer system 100 includes a planar 110, onto which is coupled a microprocessor 120. As stated above, the microprocessor generates heat, which must be dissipated. According to the preferred embodiment of the present invention, a heat conductive jacket 130 is placed in thermal contact with the microprocessor 120. The heat conductive jacket 130 is adapted to allow a cooling fluid (not shown) to circulate through it, and is preferably made of copper, or any other suitable heat conductive material.

Figure 2:
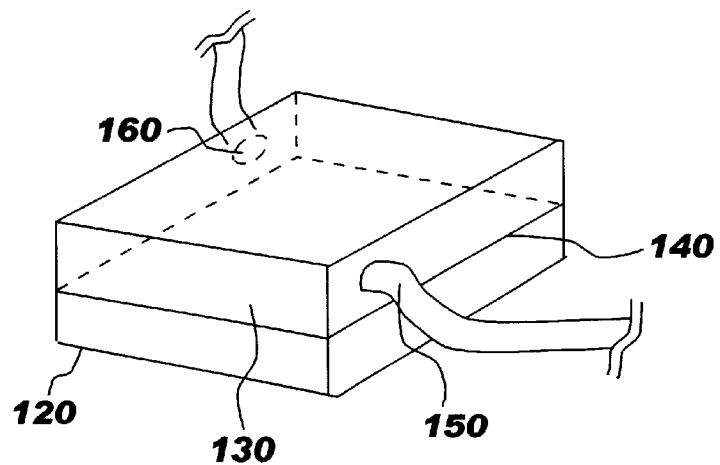
FIG. 2 illustrates a perspective view of the heat conductive jacket attached to the microprocessor in accordance with the preferred embodiment of the present invention.

FIG. 2 illustrates a perspective view of the heat conductive jacket 130 attached to the microprocessor 120. Preferably, a heat conductive adhesive 140 is disposed between the jacket 130 and the microprocessor 120 to secure one to the other. Two ports, an inlet port 150 and an outlet port 160, are provided in the jacket 130 to allow the cooling fluid (not shown) to circulate into and out of the jacket 130. Inlet port 150 and outlet port 160 are located at opposite corners of the jacket 130 to ensure that the cooling fluid flows across the entire surface of the microprocessor 120.

Figure 3:
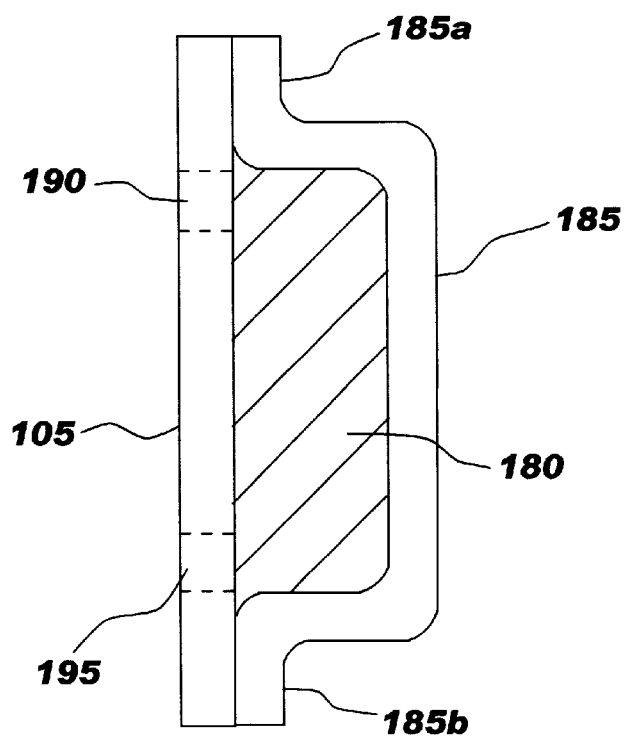
FIG. 3 is a cross sectional view of the heat collecting chamber in accordance with a first preferred embodiment of the present invention.

Referring back to FIG. 1, a heat collecting chamber 180 is a closed space defined by the cavity formed between a portion of the chassis 105 and a second sheet 185 bonded thereto. The heat collecting chamber 180 is designed to receive the cooling fluid (not shown). FIG. 3 is a cross sectional view of the heat collecting chamber 180 in accordance with a first preferred embodiment. As is shown, the second sheet 185 is crimped at the top 185*a* and bottom 185*b* edges. Although not shown, the second sheet's 185 side edges are also crimped so that when the second sheet 185 is bonded to the chassis 105, the heat collecting chamber 180 is sealed on all sides. The second sheet 185 can be bonded to the chassis 105, for example, by spot welding techniques.

Figure 4A:
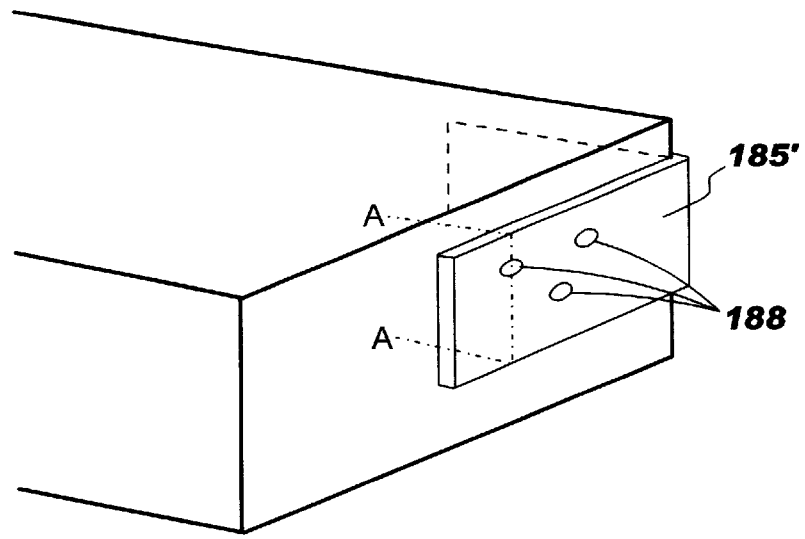
FIGS. 4A and 4B illustrate a second preferred embodiment of the heat collecting chamber in accordance with the present invention.
Figure 4B:
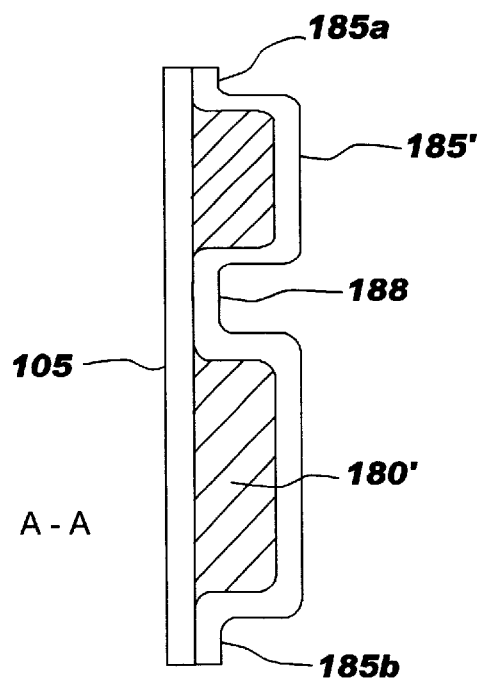

FIGS. 4A and 4B illustrate a second preferred embodiment of the heat collecting chamber 180' in accordance with the present invention. The second sheet 185' further includes a plurality of dimples, created, for example, by spot welds 188. As is shown, a dimple 188 is an indentation in the sheet 185.' Along with the sheet's top 185a, bottom 185b, and side edges, the plurality of dimples 188 are bonded to the chassis 105, for example by spot welding. FIG. 4B illustrates one dimple 188 spot welded to the chassis 105. As FIG. 4B shows, by bonding the dimple 188 to the chassis 105, the fluid path becomes disrupted, i.e., the cooling fluid must circulate around the bonded dimple 188. This disruption causes turbulence, which, in turn, increases the heat transfer rate from the fluid to the chassis 105 and second sheet 185'.

In either embodiment, the second sheet 185, 185' is a conventional sheet metal, and can be the same sheet metal used for the chassis 105. Although the second sheet 185 is shown as an outer skin to the chassis 105, it is also possible to bond the second sheet 185 to the inner surface of the chassis 105 to form the chamber 180. Additionally, the creation of the "double wall" chamber 180 on the chassis 105 and/or the spot welding of dimples 188 increases the rigidity of the chassis 105. Therefore, if desired, a lighter gage sheet metal can be used for the chassis 105 without sacrificing rigidity, thereby resulting in cost savings and weight savings.

Referring once again to FIG. 1, the heat collecting chamber 180 includes two openings, an inlet opening 190 and an outlet opening 195. Each opening 190, 195 is preferably located at opposite ends of the chamber 180. The vertical location of the outlet opening 195 is near the bottom 180b of the chamber 180, while the vertical location of the inlet opening 190 is near the top 180a of the chamber 180. The arrangement of the openings 190, 195 is important to the operation of the present invention, and will be discussed in more detail below.

A first hollow tube 170a, such as a flexible plastic tube, connects the heat conductive jacket's outlet port 160 to the heat collecting chamber's inlet opening 190 and a second hollow tube 170b connects the chamber's outlet opening 195 to the jacket's inlet port 150. Accordingly, the heat conductive jacket 130, the first hollow tube 170a, the second hollow tube 170b and the heat collecting chamber 180 form a closed loop, through which the cooling fluid (not shown) circulates in the direction of the arrows.

According to the preferred embodiment of the present invention, the cooling fluid is one which exhibits a high boiling point and a low freezing point, such as a 50/50 mixture of water and ethylene glycol. Furthermore, this 50/50 mix of water and ethylene glycol will protect the sheet metal chassis from corrosion. The cooling fluid enters the jacket 130 at a temperature $T_1$. Heat generated by the microprocessor 120 is passed through the jacket 130 and absorbed by the cooling fluid, thereby raising the temperature of the cooling fluid to $T_2$. The heated fluid circulates out of the jacket 130 and enters the heat collecting chamber 180, where the fluid dissipates heat to the chassis 105 and second sheet 185. As the fluid cools to $T_1$, it sinks to the bottom 180b of the chamber 180 and circulates out of the chamber 180 through the outlet opening 195, and back into the jacket 130.

As stated above, the location of the heat collecting chamber's inlet opening 190 relative to the chamber's outlet opening 195 is important to the operation of the present invention. By locating the chamber's outlet opening 195 lower than the chamber's inlet opening 190, the present invention takes advantage of a "thermal siphoning effect." The principle underlying thermal siphoning is that heat rises, while cold sinks. Thus, by introducing the heated cooling fluid (at $T_2$) near the top 180a of the heat collecting chamber 180 via the inlet opening 190, the fluid will tend to sink to the bottom 180b of the chamber 180 because as the fluid cools it becomes more dense. Accordingly, the cooling fluid circulates from the top 180a of the chamber 180 to its bottom 180b as it cools, and exits from the outlet opening 195 to return to the jacket 130.

By utilizing the present invention, a portion of the chassis 105 of the computer system or equipment behaves as a heat sink to dissipate heat generated from the enclosed components. Moreover, the cooling system according to the preferred embodiment of the present invention operates naturally without the need for mechanical devices, such as a pump or a fan.

Figure 5:
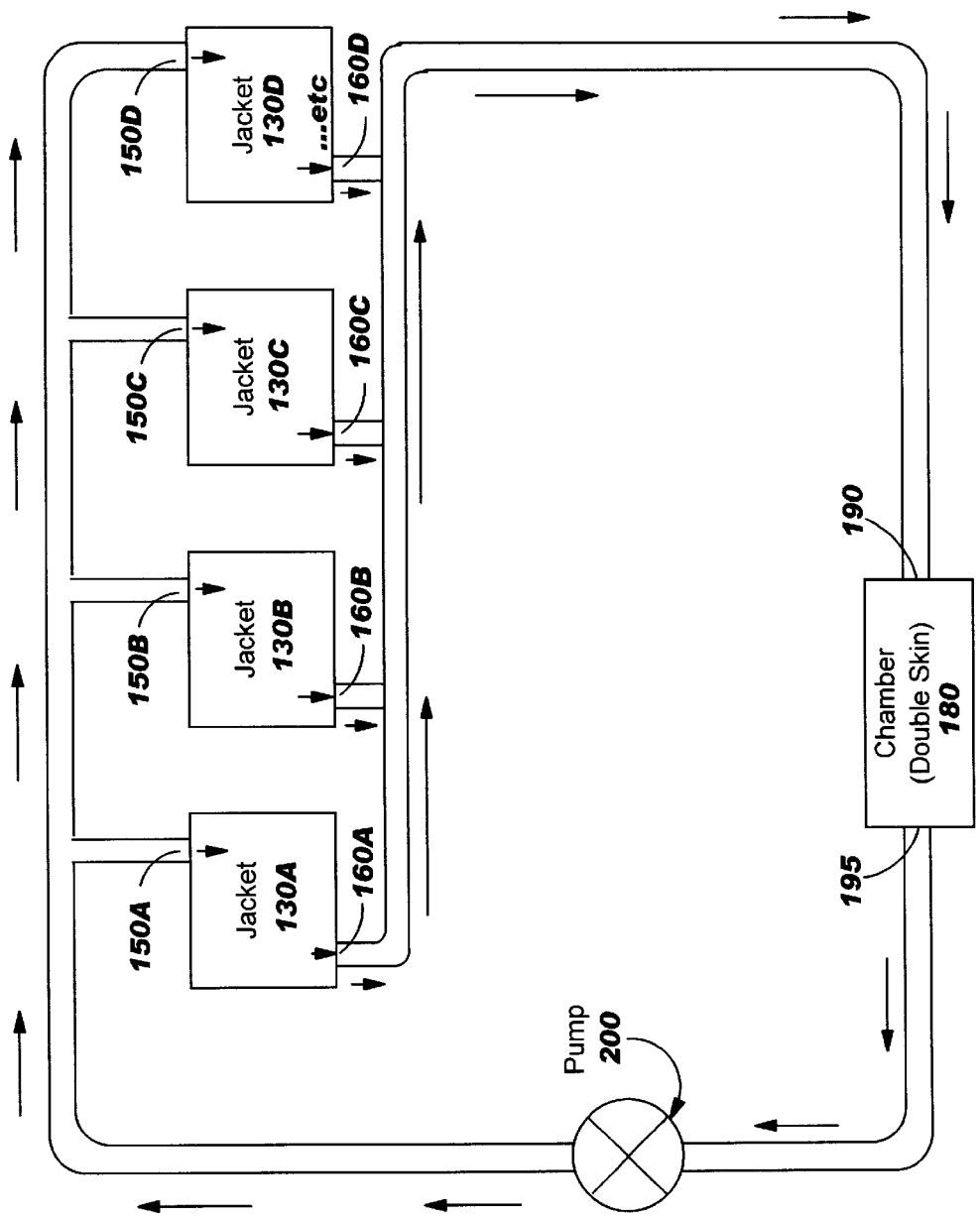
FIG. 5 is a schematic view of a third embodiment of the cooling system in accordance with the present invention.

In addition, as shown schematically in FIG. 5, a pump 200 can be connected in series to the chamber 180 and a plurality of jackets 130A–130D to enhance fluid circulation. The pump 200 is preferably a centrifugal pump typically used in automobile windshield wiper assemblies, which are small, cost efficient, and readily available commercially. As is shown, each jacket 130–130D is coupled to a component (not shown), such as a microprocessor or any other heat generating component, and the jackets 130A–130D are coupled to the closed loop in parallel.

Thus, the system of the present invention is compact and completely contained, and does not add to the overall size of the computer system. This feature is especially beneficial for rack mounted equipment, where racks are built to accommodate standard sized pieces of equipment and space is limited. As an added advantage, the "double-walled" chamber 180 increases the rigidity of the chassis. Therefore, a lighter gage sheet metal can be used for the chassis without sacrificing rigidity, thereby resulting in cost savings and weight savings. By judicious design of the heat collecting chamber 180, an engineer can design-in stiffness, lightness and low cost. Finally, the present invention is reliable, relatively easy to implement and cost efficient because all of the parts are available commercially or easily machined.

Although the present invention has been described in accordance with the embodiments shown, one of ordinary skill in the art will readily recognize that there could be variations to the embodiments and those variations would be within the spirit and scope of the present invention. For instance, the heat conductive jacket can be attached to any heat generating component and is not limited to cooling microprocessors. Accordingly, many modifications may be made by one of ordinary skill in the art without departing from the spirit and scope of the appended claims.

What is claimed is:

1. A system for cooling a component in a computer system, the computer system being enclosed by a chassis, the system comprising:

a heat collection chamber, wherein the heat collection chamber is a closed space defined by a cavity formed between the chassis and a second surface bonded to a least a portion of the chassis, the heat collection chamber further including an inlet opening and an outlet opening, wherein the inlet opening is located in a position vertically higher than a location of the outlet opening;

a heat conductive jacket adapted to be in thermal contact with the component, the jacket including an inlet port and an outlet port through which a cooling fluid circulates;

a first tube for coupling the outlet port to the inlet opening; and a second tube for coupling the outlet opening to the inlet port; and a closed loop path formed by the first and second tubes to and from the jacket through the chamber, wherein the cooling fluid circulates through the closed loop path without requiring a pumping device.

2. The system of claim 1, wherein the heat conductive jacket comprises a copper jacket.

3. The system of claim 1, wherein the cooling fluid comprising a mixture of water and ethylene glycol in substantially equal parts.

4. The system of claim 1, wherein the component is a microprocessor.

5. The system of claim 1, wherein each of the first tube and second tube comprising a flexible plastic tube.

6. The system of claim 1, wherein the second surface comprising a plurality of dimples, the plurality of dimples being bonded to the at least one portion of the chassis forming the heat collection chamber, such that the chamber is divided into a plurality of channels through which the cooling fluid circulates, thereby creating turbulence and increasing heat transfer from the cooling fluid to the chassis.

7. The system of claim 6, wherein the chassis and the second surface are sheet metal, the second surface being spot welded to the portion of the chassis, and the plurality of dimples being spot welds.

8. A system for cooling a component in a computer system, the computer system being enclosed by a chassis, the system comprising:

a heat collection chamber, wherein the heat collection chamber is a closed space defined by a cavity formed between the chassis and a second surface bonded to a least a portion of the chassis, the heat collection chamber further including an inlet opening and an outlet opening, wherein the inlet opening is located in a position vertically higher than a location of the outlet opening;

a copper jacket adapted to be in thermal contact with the component, the jacket including an inlet port and an outlet port through which a cooling fluid circulates;

a first tube for coupling the outlet port with the inlet opening;

a second tube for coupling the outlet opening with the inlet port; and a closed loop path formed by the first and second tubes to and from the jacket through the chamber, wherein the cooling fluid circulates through the closed loop path without requiring a pumping device.

9. The system of claim 8, wherein the component is a microprocessor.

10. The system of claim 8, wherein the cooling fluid comprising a mixture of water and ethylene glycol in substantially equal parts.

11. A system for cooling a microprocessor in a computer system, the computer system being enclosed by a chassis, the system comprising:

a heat collection chamber, wherein the heat collection chamber is a closed space defined by a cavity formed between the chassis and a second surface bonded to a least a portion of the chassis, the heat collection chamber further including an inlet opening and an outlet opening, wherein the inlet opening is located in a position vertically higher than a location of the outlet opening;

a copper jacket adapted to be in thermal contact with the microprocessor, the copper jacket including an inlet port and an outlet port through which a cooling fluid comprising a mixture of water and ethylene glycol circulates;

a first flexible plastic tube for coupling the outlet port with the inlet opening; and a second flexible plastic tube for coupling the outlet opening with the inlet port; and a closed loop path formed by the first and second tubes to and from the jacket through the chamber, wherein the cooling fluid circulates through the closed loop path without requiring a pumping device, and as the cooling fluid circulates through the closed loop path, heat is transferred from the component to the cooling fluid via the jacket, and in turn, the heat from the cooling fluid is transferred to the chassis via the chamber.

12. A system for cooling a component in a computer system, the computer system being enclosed by a chassis, the system comprising:

a heat collection chamber, wherein the heat collection chamber is a closed space defined by a cavity formed between the chassis and a second surface bonded to at least a portion of the chassis, the second surface comprising a plurality of dimples, the plurality of dimples being bonded to the at least one portion of the chassis, the heat collection chamber further including an inlet opening and an outlet opening, wherein the inlet opening is located in a position vertically higher than a location of the outlet opening;

a heat conductive jacket adapted to be in thermal contact with the microprocessor, the jacket including an inlet port and an outlet port through which a cooling fluid circulates;

a first tube for coupling the outlet port with the inlet opening; and a second tube for coupling the outlet opening with the inlet port.

13. The system of claim 12, wherein the chassis and the second surface are sheet metal, the second surface being spot welded to the portion of the chassis, and the plurality of dimples being spot welds.

14. The system of claim 12, wherein the heat conductive jacket comprises a copper jacket.

15. The system of claim 12, wherein the cooling fluid comprising a mixture of water and ethylene glycol in substantially equal parts.

16. The system of claim 12, wherein the component is a microprocessor.

17. The system of claim 12, wherein each of the first hollow tube and second hollow tube comprising a flexible plastic tube.

18. The system of claim 12 further comprising a centrifugal pump coupled to a closed loop fluid path formed by the jacket and the chamber.

19. A system for cooling a component in a computer system, the computer system being enclosed by a chassis, the system comprising:

a heat collection chamber, wherein the heat collection chamber is a closed space defined by a cavity formed between the chassis and a second surface, the second surface being spot welded to a portion of the chassis, wherein the spot welds form a plurality of dimples, the heat collection chamber further including an inlet opening and an outlet opening, wherein the inlet opening is located in a position vertically higher than a location of the outlet opening;

a heat conductive jacket adapted to be in thermal contact with the microprocessor, the jacket including an inlet port and an outlet port through which a cooling fluid circulates;

a first tube for coupling the outlet port with the inlet opening; and a second tube for coupling the outlet opening with the inlet port.

* * * * *